United States Patent
Qiao et al.

(10) Patent No.: US 7,825,703 B2
(45) Date of Patent: Nov. 2, 2010

(54) DIVIDE-BY-THREE QUADRATURE FREQUENCY DIVIDER

(75) Inventors: Dongjiang Qiao, San Diego, CA (US); Frederic Bossu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/193,693

(22) Filed: Aug. 18, 2008

(65) Prior Publication Data

US 2010/0039153 A1 Feb. 18, 2010

(51) Int. Cl.
*H03B 19/00* (2006.01)
(52) U.S. Cl. .................. 327/117; 327/115; 377/47
(58) Field of Classification Search .............. 327/115, 327/117, 118; 377/47
See application file for complete search history.

(56) References Cited

U.S. PATENT DOCUMENTS

| | | | | |
|---|---|---|---|---|
| 4,366,394 A | * | 12/1982 | Clendening et al. | ............ 377/47 |
| 4,399,326 A | * | 8/1983 | Bode | ............ 381/101 |
| 6,389,095 B1 | * | 5/2002 | Sun | ............ 377/48 |
| 7,123,103 B1 | | 10/2006 | Rosik et al. | |
| 7,508,273 B2 | | 3/2009 | Redman-White | |
| 7,667,505 B2 | * | 2/2010 | Roine | ............ 327/115 |
| 2008/0260089 A1 | * | 10/2008 | Roine | ............ 377/47 |

FOREIGN PATENT DOCUMENTS

EP 0926833 6/1999

OTHER PUBLICATIONS

Oguey et al. "CODYMOS Frequency Dividers Achieve Low Power Consumption and High Frequency", Electronic Letters, Aug. 23, 1973, pp. 386-387, vol. 9, Issue 17.
Oguey, H.; Vittoz, C.; , "CODYMOS frequency dividers achieve low power consumption and high frequency," Electronics Letters, vol. 9, No. 17, pp. 386-387, Aug. 23, 1973.

* cited by examiner

*Primary Examiner*—Lincoln Donovan
*Assistant Examiner*—William Hernandez
(74) *Attorney, Agent, or Firm*—Jiayu Xu (57) ABSTRACT

A local oscillator includes a programmable frequency divider coupled to the output of a VCO. The frequency divider can be set to frequency divide by three. Regardless of the divisor, the frequency divider outputs quadrature signals (I, Q) that differ from each other in phase by ninety degrees. To divide by three, the frequency divider includes a divide-by-three frequency divider. The divide-by-three frequency divider includes a divide-by-three circuit, a delay circuit, and a feedback circuit. The divide-by-three circuit frequency divides a signal from the VCO and generates therefrom three signals C, A' and B that differ from each other in phase by one hundred twenty degrees. The delay circuit delays signal A' to generate a delayed version A of the signal A'. The feedback circuit controls the delay circuit such that the delayed version A (I) is ninety degrees out of phase with respect to the signal C (Q).

31 Claims, 9 Drawing Sheets

FEEDBACK CONTROLS DELAY CIRCUIT SUCH THAT A IS 90 DEGREES OUT OF PHASE WITH RESPECT TO C

| FREQUENCY BAND | UNIT | VCO OUTPUT MIN | VCO OUTPUT MAX | LO DIVIDER | LO MIN | LO MAX |
|---|---|---|---|---|---|---|
| 900 MHZ | MHZ | 3660 | 3840 | 4 | 915 | 960 |
| PDC | MHZ | 2950 | 3002 | 2 | 1475 | 1501 |
| ATC-MSS L BAND | MHZ | 3252 | 3320 | 2 | 1626 | 1660 |
| UMTS1700/1800 AND KPCS | MHZ | 3610 | 3760 | 2 | 1805 | 1880 |
| US PCS | MHZ | 3860 | 3990 | 2 | 1930 | 1995 |
| IMT/AWS | MHZ | 4220 | 4340 | 2 | 2110 | 2170 |
| ATC-MSS S BAND | MHZ | 4360 | 4400 | 2 | 2180 | 2200 |
| IMT EXT/BRS-TDD | MHZ | 5000 | 5380 | 2 | 2500 | 2690 |

WIDE VCO TUNING RANGE REQUIRED (2950 TO 5380 MHZ)

(PRIOR ART)

FIG. 2

(PRIOR ART)

FIG. 3

(PRIOR ART)

| FREQUENCY BAND | UNIT | VCO OUTPUT MIN | VCO OUTPUT MAX | LO DIVIDER | LO MIN | LO MAX |
|---|---|---|---|---|---|---|
| 900 MHZ | MHZ | 3660 | 3840 | 4 | 915 | 960 |
| PDC | MHZ | 4425 | 4503 | 3 | 1475 | 1501 |
| ATC-MSS L BAND | MHZ | 4878 | 4980 | 3 | 1626 | 1660 |
| UMTS1700/1800 AND KPCS | MHZ | 3610 | 3760 | 2 | 1805 | 1880 |
| US PCS | MHZ | 3860 | 3990 | 2 | 1930 | 1995 |
| IMT/AWS | MHZ | 4220 | 4340 | 2 | 2110 | 2170 |
| ATC-MSS S BAND | MHZ | 4360 | 4400 | 2 | 2180 | 2200 |
| IMT EXT/BRS-TDD | MHZ | 5000 | 5380 | 2 | 2500 | 2690 |

WITH DIVIDE-BY-3 DIVIDER LESS VCO
TUNING RANGE IS REQUIRED (3610 TO 5380 MHZ)

FIG. 9

FEEDBACK CONTROLS DELAY CIRCUIT SUCH THAT A IS 90
DEGREES OUT OF PHASE WITH RESPECT TO C

DIVIDE-BY-THREE QUADRATURE FREQUENCY DIVIDER

BACKGROUND INFORMATION

1. Technical Field

The disclosed embodiments relate to frequency dividers.

2. Background Information

Figure 1:
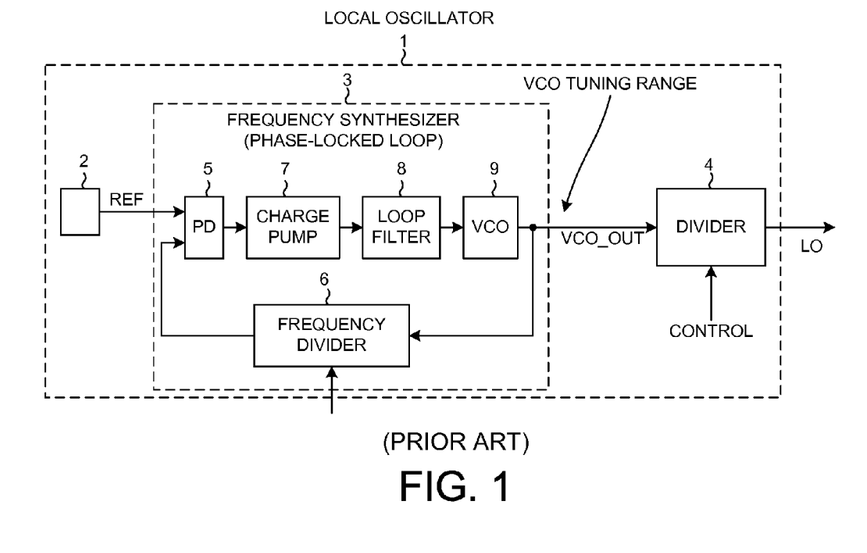
FIG. 1 (Prior Art) is a diagram of one example of a local oscillator usable in a cellular telephone.

FIG. 1 (Prior Art) is a diagram of one example of a local oscillator 1. Radio receivers and radio transmitters, such as are found in cellular telephones, often involve multiple such local oscillators. A local oscillator of this type generally involves a reference clock source 2, a phase-locked loop 3, and a frequency divider 4. In the illustrated example, a phase detector 5 receives a reference clock signal REF from reference clock source 2 and also receives a feedback signal from a frequency divider 6. Phase detector 5 outputs a phase error signal that is supplied to a charge pump 7. The output of charge pump 7 is filtered by a loop filter 8 to generate a voltage level signal. The voltage level signal is supplied onto the control input lead of a voltage controlled oscillator (VCO) 9. The voltage on the control input lead of VCO 9 determines the frequency of the signal VCO_OUT output by VCO 9. Frequency divider 6 frequency divides VCO_OUT and supplies the resulting frequency-divided signal to phase detector 5 as the feedback signal. When the phase-locked loop is locked, the feedback signal and the signal REF are in phase, and the frequency of VCO_OUT is determined by the divisor number by which frequency divider 6 divides. The frequency of VCO_OUT is the product of the divisor number and the frequency of the reference clock REF. The VCO_OUT signal is typically not output as the local oscillator output signal (LO), but rather the VCO_OUT signal is frequency divided to a lower frequency by a second frequency divider 4. Frequency divider 4 may, for example, be set to frequency divide by a relatively small integer number such as two, or four, or eight.

Figure 2:
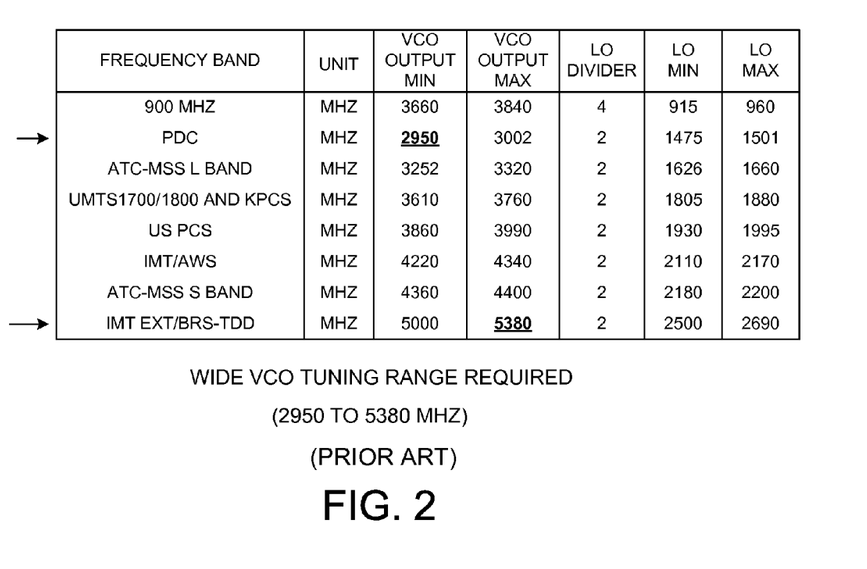
FIG. 2 (Prior Art) is a chart that illustrates how the VCO of the local oscillator of FIG. 1 has an undesirably wide VCO tuning range.

In the case of integrated transceiver integrated circuits within cellular telephones, it is often desired to make the transceiver integrated circuit such that the same integrated circuit design can be used to communicate in any one of multiple different frequency bands. FIG. 2 (Prior Art) sets forth examples of various frequency bands over which a single receiver (within a transceiver integrated circuit of a cellular telephone) might be required to communicate. The rightmost two columns of FIG. 2 indicate the output frequencies of the needed local oscillator (LO) signals to be generated. The column designated "LO DIVIDER" indicates the number by which the frequency divider 4 divides. The two columns designated "VCO OUTPUT MIN" and VCO OUTPUT MAX" set forth the corresponding VCO output frequencies need to generate the desired LO MIN and LO MAX frequencies, given the specified divisor in the LO DIVIDER column. To generate the required local oscillator output signal of the desired frequencies, note that the VCO output frequency must be able to range from 2950 megahertz to 5380 megahertz. This is a relatively wide VCO tuning range. It may be difficult to realize a VCO with a wide tuning range, or it may be for other reasons undesirable to have to provide such a wide VCO tuning range.

If frequency divisor 4 could be set to divide by three, then it might be possible to reduce the VCO tuning range. Although frequency dividers that frequency divide by three are known, such frequency dividers are generally not usable because the local oscillator output signal desired is often actually not just one signal (LO), but rather is a pair of signals, where the phase of one of the signal is ninety degrees out of phase with respect to the other of the signals. Such LO signals are referred to as quadrature signals, or the local oscillator signal are said to be "in quadrature". The letters I and Q are often used to designate such quadrature signals. Quadrature signals may, for example, be required by other receiver circuitry to perform phase shift keying modulation and/or to perform image canceling.

Figure 3:
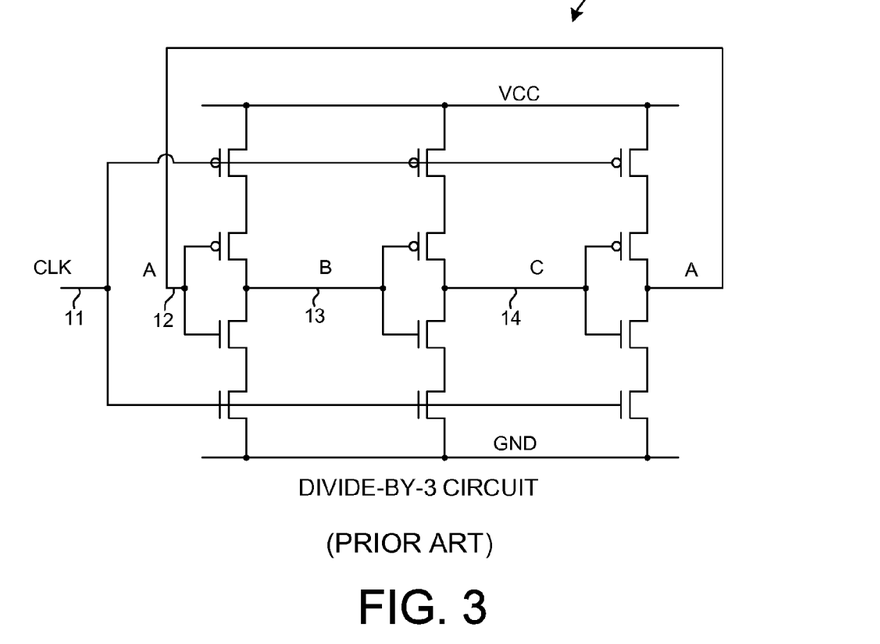
FIG. 3 (Prior Art) is a diagram of a prior art divide-by-three frequency divider circuit.
Figure 4:
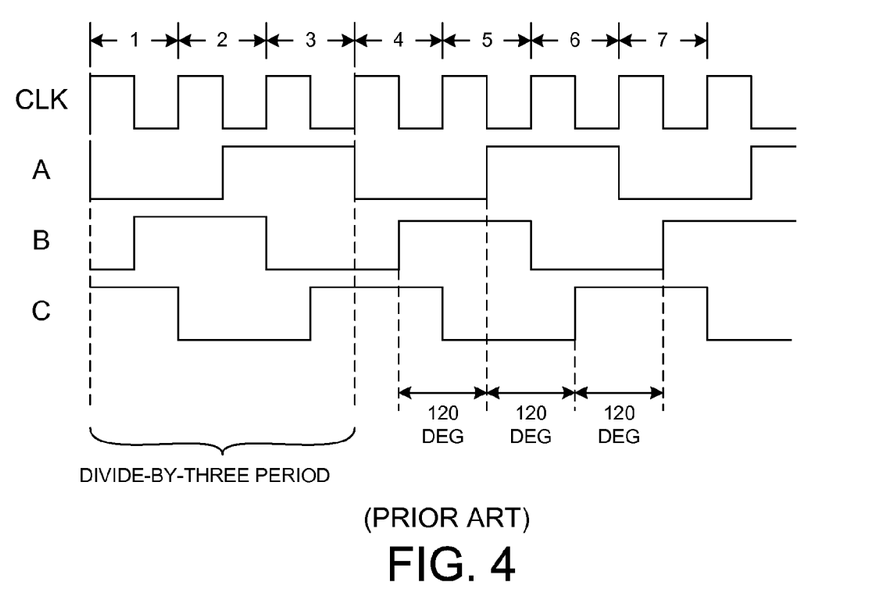
FIG. 4 (Prior Art) is a waveform diagram that illustrates an operation of the prior art divide-by-three frequency divider circuit of FIG. 3.

FIG. 3 (Prior Art) is an example of a prior art divide-by-three frequency divider 10 set forth in 1973 in the article entitled "Low Power Consumption And High Frequency", Electronics Letters, Issue 17, vol. 9, Aug. 23, 1973, by H. Oguey and C. Vittoz. FIG. 4 (Prior Art) is a waveform diagram that illustrates operation of the circuit. When an input clock signal CLK of frequency 3F is supplied onto input lead 11, the circuit generates three signals A, B and C on nodes 12, 13 and 14, respectively, of frequency F. No two of the signals A, B and C are ninety degrees out of phase with respect to each other, so such a frequency divider is not used for frequency divider 4 in the local oscillator 1 of FIG. 1 if quadrature local oscillator output signals are to be generated.

SUMMARY

A local oscillator includes a programmable frequency divider coupled to the output of a voltage-controlled oscillator (VCO). The programmable frequency divider can be set to divide by three. Regardless of the number by which the programmable frequency divider divides, the programmable frequency divider outputs fifty percent duty cycle quadrature signals (I, Q) that differ from each other in phase by ninety degrees. To divide by three, the frequency divider includes a divide-by-three frequency divider. The divide-by-three frequency divider includes a divide-by-three circuit, a delay circuit, and a feedback circuit.

The divide-by-three circuit frequency divides an input signal received from the VCO and generates therefrom three signals C, A' and B that differ from each other in phase by one hundred twenty degrees. The delay circuit delays the second signal A' to generate a delayed version A of the second signal. The feedback circuit controls the delay circuit such that the delayed version A is ninety degrees out of phase with respect to first signal C. The delayed version A is usable as the quadrature signal I and the first signal C is usable as the quadrature signal Q. The feedback loop automatically corrects for changes and/or variations in circuit operation due to temperature changes, supply voltage changes and/or variations in semiconductor fabrication processing.

The programmable frequency divider may be realized in an RF transceiver integrated circuit within a cellular telephone. A processor executing instructions in a digital baseband integrated circuit can set the divisor by which the programmable frequency divider divides by communicating appropriate control information across a bus from the digital baseband integrated circuit to the RF transceiver integrated circuit.

In one specific example, the feedback circuit includes a digital logic portion and an average and compare circuit portion. The digital logic portion receives the signals A and C and generates a digital signal indicative of an amount of time T1 between a first edge of signal A and an edge of the signal C. The digital logic portion also generates a digital signal indicative of an amount of time T2 between the edge of the signal C and a second edge of signal A. The digital signal indicative of the amount of time T1 is converted into a voltage level signal indicative of the amount of time T1. The digital signal indicative of the amount of time T2 is converted into a voltage level signal indicative of the amount of time T2. The two voltage level signals are supplied to the inputs of an operational amplifier such that the operational amplifier generates a control signal. The control signal is converted into a bias voltage control signal that is supplied to the delay circuit. Through this feedback loop, the feedback circuit operates to control the delay of the delay circuit such that the phase difference between the signal C and the signal A is ninety degrees.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 5:
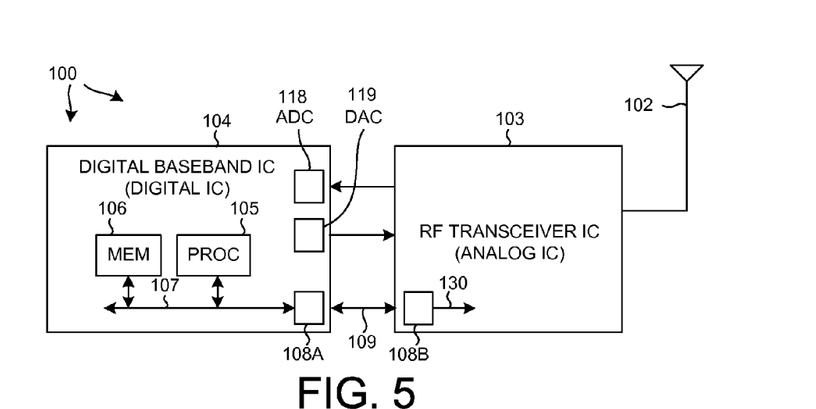
FIG. 5 is a high level block diagram of a mobile communication device 100 in accordance with one novel aspect.

FIG. 5 is a very simplified high level block diagram of one particular type of mobile communication device 100 in accordance with one novel aspect. In this particular example, mobile communication device 100 is a 3G cellular telephone capable of operating in accordance with either a Code Division Multiple Access (CDMA) cellular telephone communication protocol or a GSM (Global System for Mobile Communications) cellular telephone communication protocol. The cellular telephone includes (among several other parts not illustrated) an antenna 102 and two integrated circuits 103 and 104. Integrated circuit 104 is called a "digital baseband integrated circuit" or a "baseband processor integrated circuit". Digital baseband integrated circuit 104 includes, among other parts not illustrated, a digital processor 105 that executes instructions stored in a processor-readable medium 106. Processor 105 can cause information to be communicated across bus 107 and bus interface 108A and bus conductors 109 and to bus interface 108B of integrated circuit 103. Integrated circuit 103 is an RF transceiver integrated circuit. RF transceiver integrated circuit 103 is called a "transceiver" because it includes a transmitter as well as a receiver.

Figure 6:
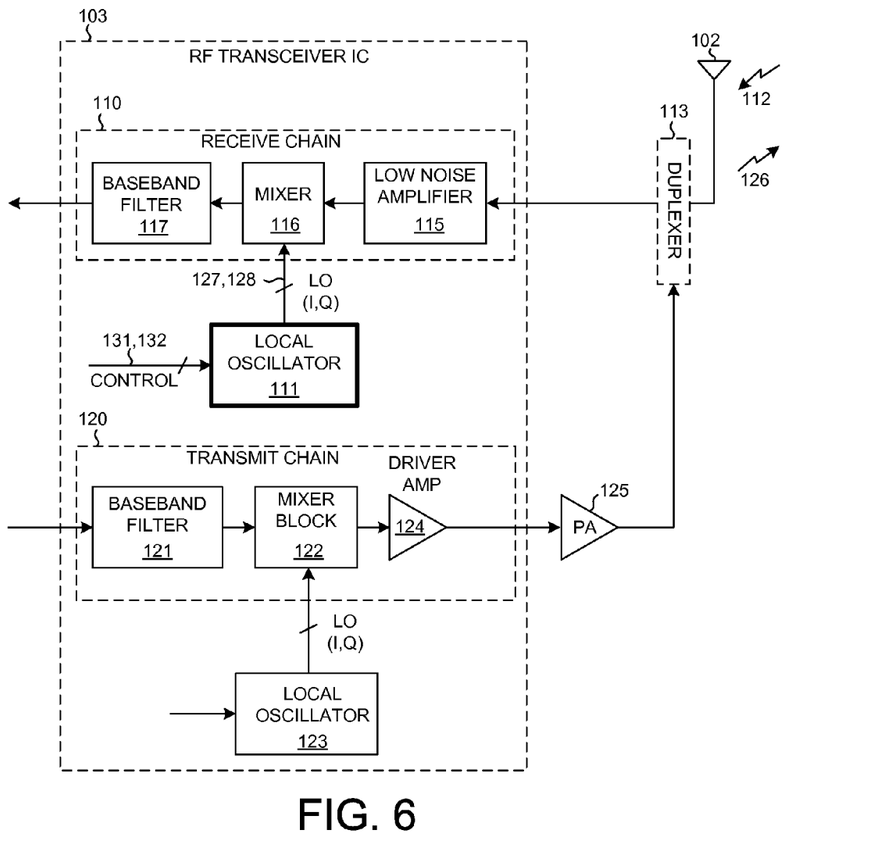
FIG. 6 is a more detailed block diagram of the RF transceiver integrated circuit 103 of FIG. 5.

FIG. 6 is a more detailed block diagram of the RF transceiver integrated circuit 103 of FIG. 5. The receiver includes what is called a "receive chain" 110 as well as a local oscillator 111. When the cellular telephone is receiving, a high frequency RF signal 112 is received on antenna 102. Information from signal 112 passes through duplexer 113, and into receive chain 110. Signal 112 is amplified by low noise amplifier (LNA) 115 and is down-converted in frequency by mixer 116. The resulting down-converted signal is filtered by baseband filter 117 and is passed to the digital baseband integrated circuit 104. An analog-to-digital converter 118 in the digital baseband integrated circuit 104 converts the signal into digital form and the resulting digital information is processed by digital circuitry in the digital baseband integrated circuit 104. The digital baseband integrated circuit 104 tunes the receiver by controlling the frequency of quadrature local oscillator signals I and Q supplied by local oscillator 111 to mixer 116 on conductors 127 and 128.

If the cellular telephone is transmitting, then information to be transmitted is converted into analog form by a digital-to-analog converter 119 in the digital baseband integrated circuit 104 and is supplied to a "transmit chain" 120. Baseband filter 121 filters out noise due to the digital-to-analog conversion process. Mixer block 122 under control of local oscillator 123 then up-converts the signal into a high frequency signal. Driver amplifier 124 and an external power amplifier 125 amplify the high frequency signal to drive antenna 102 so that a high frequency RF signal 126 is transmitted from antenna 102. The digital baseband integrated circuit 104 tunes the transmitter by controlling the frequency of local oscillator quadrature signals I and Q supplied by local oscillator 123 to mixer 122. Arrow 130 represents information that is communicated from digital baseband integrated circuit 104, through bus interface 108A, across bus conductors 109, through bus interface 108B, and through conductors 131 and 132 to local oscillator 111 to set the divisor number by which a frequency divider within local oscillator 111 divides as is explained in further detail below.

Figure 7:
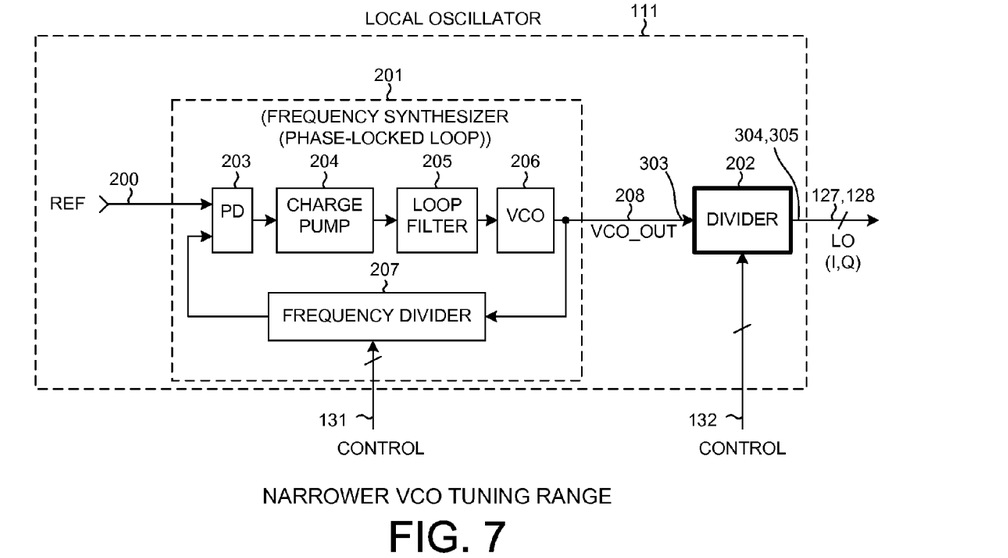
FIG. 7 is a more detailed diagram of the local oscillator 111 of FIG. 6.

FIG. 7 is a more detailed diagram of local oscillator 111. Local oscillator 111 includes a reference clock source 200 (identified here by a conductor), a frequency synthesizer 201, and a novel programmable frequency divider 202. Frequency synthesizer 201, in the illustrated example, is an analog phase-locked loop (PLL) that includes a phase detector 203, a charge pump 204, a loop filter 205, a voltage controlled oscillator (VCO) 206 and a frequency divider 207. The receiver of receive chain 110 is tuned by setting the frequency of the local oscillator output quadrature signals I and Q on conductors 127 and 128, respectively. The frequency of the quadrature signals I and Q is determined by the divisor by which frequency divider 207 divides and by the divisor by which programmable frequency divider 202 divides. The frequency of the reference clock REF is fixed. The divisor by which frequency divider 207 divides is set by the value supplied onto control conductors 131. The divisor by which frequency divider 202 divides is set by the value supplied onto control conductors 132. In this example, digital baseband integrated circuit 104 of FIG. 5 controls these divisor values via bus 109.

Figure 8:
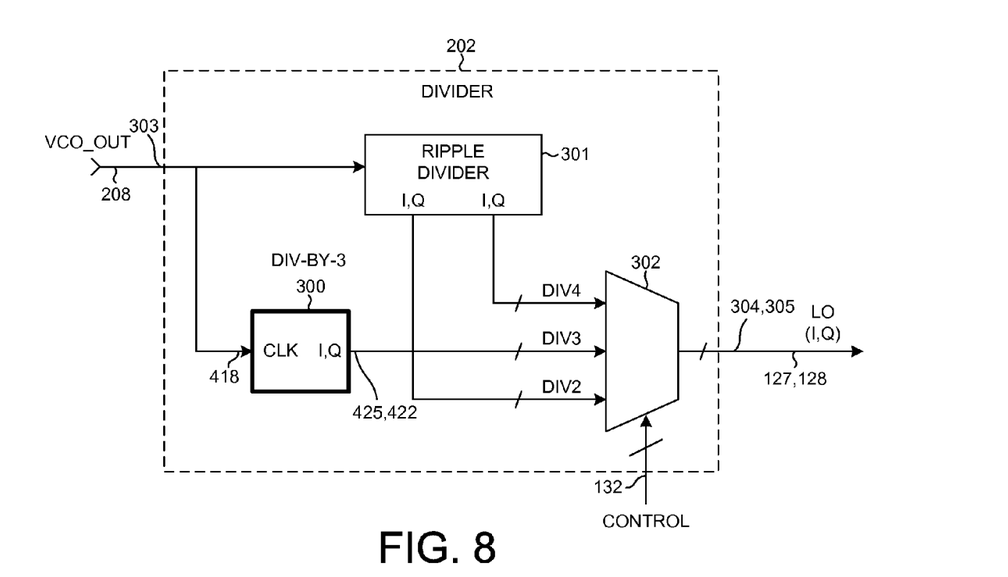
FIG. 8 is a more detailed diagram of the programmable frequency divider 202 of the local oscillator 111 of FIG. 7.

FIG. 8 is a more detailed diagram of novel programmable frequency divider 202 of FIG. 7. Programmable frequency divider 202 includes a novel divide-by-three frequency divider 300, a ripple divider 301, and multiplexing circuitry 302. The VCO_OUT signal from VCO 206 is received via conductor 208 onto input lead 303 of the frequency divider 202. Ripple divider 301 is a binary divider that has several stages. The first stage outputs a set of quadrature signals that has a frequency of half of the frequency of the signal VCO_OUT. These signals are designated DIV2 in FIG. 8. The second stage outputs a set of quadrature signals that has a frequency of one quarter of the frequency of the signal VCO_OUT. These signals designated DIV4 in FIG. 8. The novel divide-by-three frequency divider 300 frequency divides the signal VCO_OUT by three and outputs a set of quadrature signals whose frequency is one third of the frequency of VCO_OUT. These signals are designated DIV3 in FIG. 8. Which one of the three sets of quadrature signals is output from frequency divider 202 onto output leads 304 and 305 is determined by the digital value on the control conductors 132. Although a multiplexer symbol is illustrated to represent the multiplexing function, a multiplexer need not be used. In one example, the three I output conductors from blocks 300 and 301 are coupled together, and the three Q output conductors from blocks 300 and 301 are coupled together. The control value on control conductor 132 enables the appropriate one of blocks 300 and 301 to drive the appropriate set of I and Q signals onto the output leads 304 and 305. Each of the output leads 304 and 305 therefore serves as a sort of wired-OR output.

Figure 9:
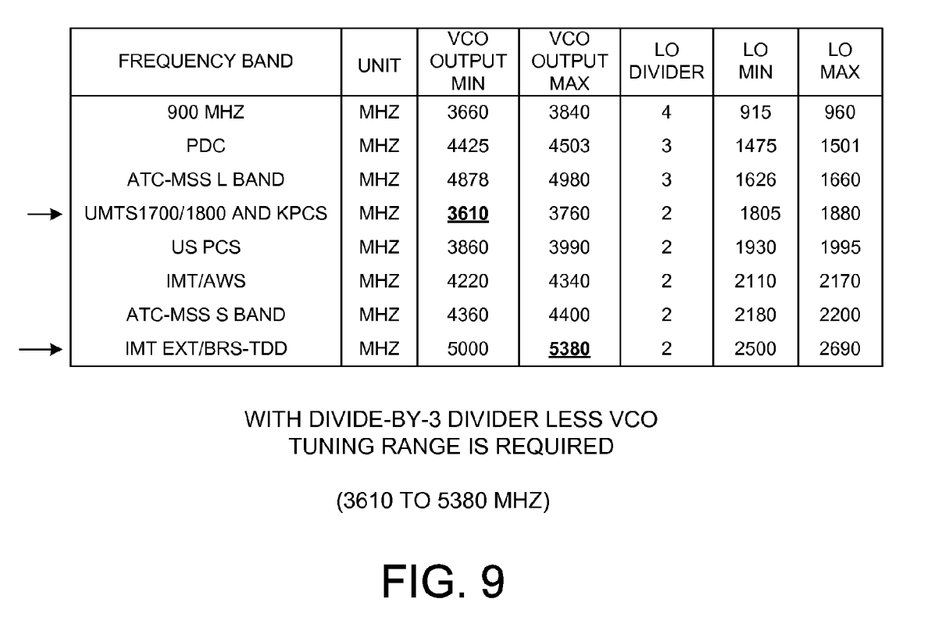
FIG. 9 is a chart that illustrates how the VCO of the local oscillator 111 of FIG. 7 has a narrower VCO tuning range than the VCO of the prior art circuit of FIG. 1.

FIG. 9 is a chart that illustrates an advantage realized by novel frequency divider 202. Frequency divider 202 can frequency divide by either two, or three or four. For all three divisor values, frequency divider 202 outputs quadrature signals I and Q. Note that in the chart of FIG. 9 the same frequency bands and the same "LO MIN" and "LO MAX" frequencies appear as in the prior art chart of FIG. 2, but note that in the chart of FIG. 9 the "LO DIVIDER" column indicates that VCO_OUT is frequency divided by three in two cases. As a result, the VCO tuning range is reduced from the wide range of FIG. 2 to a narrower tuning range of from 3610 to 5380 megahertz in the case of FIG. 9. The setting of the VCO_OUT frequency and the setting of the "LO DIVIDER" value, under each frequency band operating situation, are under control of processor 105 of the digital baseband integrated circuit 104 as explained above. In one advantageous aspect, the frequency of VCO_OUT and the divisor by which frequency divider 202 divides are set so that frequency synthesizer 201 can be of a type that has a relatively narrow VCO tuning range.

Figure 10:
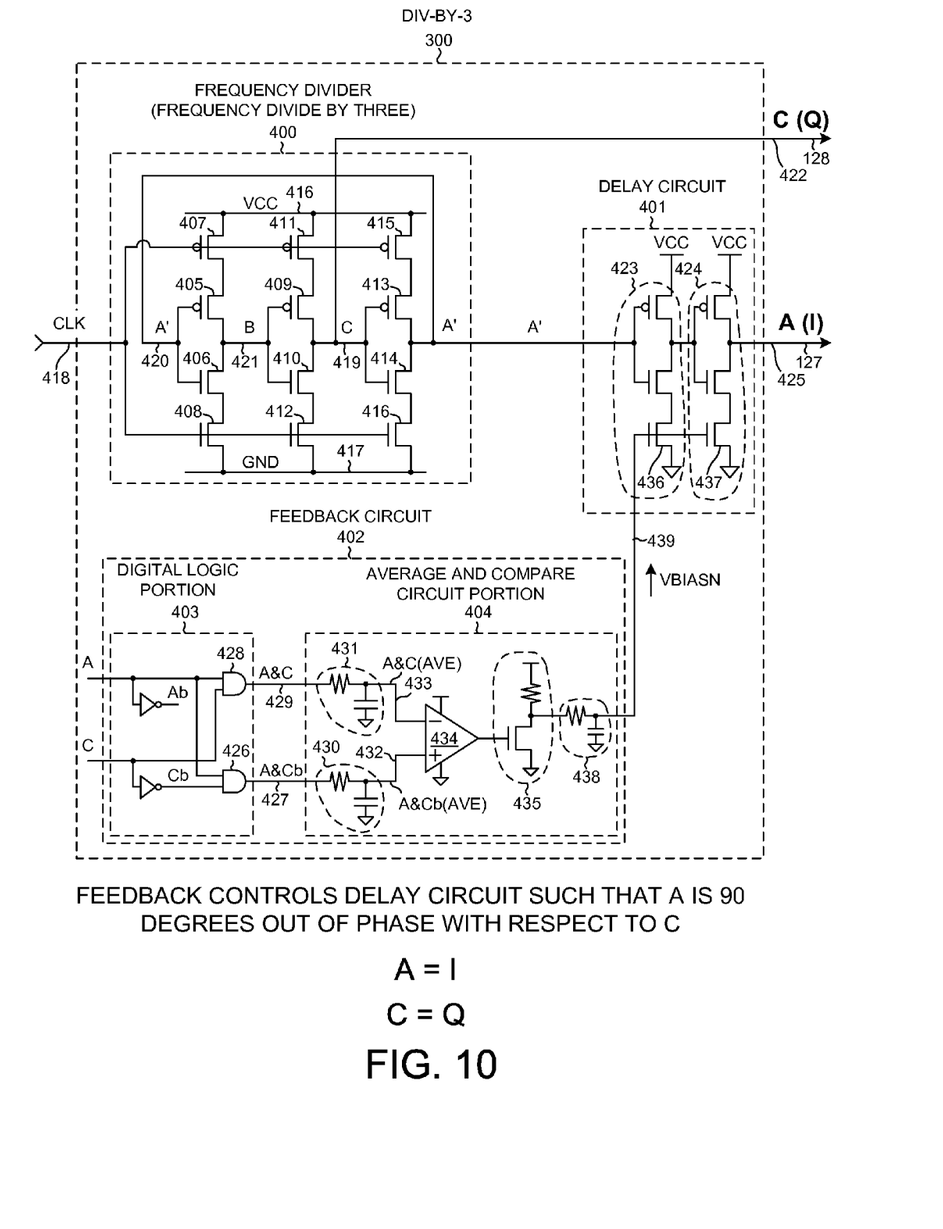
FIG. 10 is a circuit diagram of the novel divide-by-three frequency divider 300 of FIG. 8.

FIG. 10 is a more detailed diagram of one way to implement the novel divide-by-three frequency divider 300 of FIG. 8. Frequency divider 300 includes a divide-by-three frequency divider 400, a delay circuit 401 and a feedback circuit 402. Feedback circuit 402 in turn includes a digital logic portion 403 and an average and compare circuit portion 404.

In one example, frequency divider 400 is the frequency divider illustrated above in FIG. 3. Frequency divider 400 includes twelve field effect transistors (FETs) 405-416 organized into three stages as illustrated. The first stage involves a first P-channel FET field effect transistor (PFET) 405, a second PFET 407, a first N-channel field effect transistor (NFET) 406, and a second NFET 408. The gates of PFET 405 and NFET 406 are connected together, and the drains of PFET 405 and NFET 406 are connected together. The drain of second PFET 407 is coupled to the source of first PFET 405, and the drain of second NFET 408 is coupled to the source of first NFET 406. The source of second PFET 407 is connected to a supply voltage bus 416, and the source of second NFET 408 is connected to a ground bus 417. The second and third stages of transistors are coupled together in similar fashion. When an input clock signal CLK of frequency 3F (VCO_OUT) is supplied onto input lead 418, frequency divider 400 generates three signals C, A' and B on nodes 419, 420 and 421, respectively. Each of these signals has a duty cycle of approximately fifty percent. The second signal A' is approximately 120 degrees out of phase with respect to the first signal C, and the third signal B is approximately 120 degrees out of phase with respect to the second signal A', and the first signal C is approximately 120 degrees out of phase with respect to the third signal B.

The first signal C on node 419 is supplied onto output lead 422 as quadrature signal Q. The second signal A' is supplied to delay circuit 401. Delay circuit 401 generates a delayed version A of the second signal A' by passing the second signal through a pair of inverter circuits 423 and 424. Delay circuit 401 outputs the resulting delayed version A onto output lead 425 as quadrature signal I.

Feedback circuit 402 operates to control the delay through delay circuit 401 such that the signal A on output lead 425 is ninety degrees out of phase with respect to signal C on output lead 422. The digital logic portion 403 includes a first logic AND gate 426 that generates a digital signal on node 427 that is indicative of an amount of time T1 between a first rising edge of the delayed version A of the second signal and the next rising edge of the first signal C. The digital logic portion 403 includes a second logic AND gate 428 that generates a digital signal on node 429 that is indicative an amount of time T2 between the rising edge of the first signal C and a second falling edge of the delayed version A of the second signal. The first rising edge of the delayed version A of the second signal and the second falling edge of the delayed version A of the second signal define a high pulse period of delayed version A (the duration that delayed version A is at a digital logic high).

In the example of FIG. 10, if the time periods T1 and T2 were equal, then the signals I and Q on output leads 425 and 422 would be ninety degrees out of phase with respect to each other. Average and compare circuit portion 404 has a first RC low-pass filter 430 and a second RC low-pass filter 431. First RC low-pass filter 430 roughly converts the signal on node 427 into a corresponding voltage level signal on node 432. The level of the voltage on node 432 is indicative of the time T1. Similarly, second RC low-pass filter 431 roughly converts the signal on node 429 into a corresponding voltage level signal on node 433. The level of the voltage on node 433 is indicative of the time T2. An operational amplifier 434 receives the signals on nodes 432 and 433 on its non-inverting and inverting input leads, respectively, and outputs a control signal. The control signal is converted by a biasing circuit 435 into a corresponding bias voltage VBIASN that biases the transistors 436 and 437 of delay circuit 401. The higher the bias voltage VBIASN supplied onto the gates of transistors 436 and 437, the less current starved the inverter circuits 423 and 424 will be, and the faster the inverter circuits 423 and 424 will be able to switch their outputs. Accordingly, the higher the bias voltage VBIASN, the smaller the propagation delay through delay circuit 401.

Circuit 438 is provided to add a pole at the appropriate frequency to prevent the control loop from oscillating. If the voltage on node 432 is higher than the voltage on node 433, then T1 was bigger than T2, and the control voltage on node 439 is decreased to increase the delay through delay circuit 401 such that T1 and T2 are made more equal. If, on the other hand, the voltage on node 432 is lower than the voltage on node 433, then T1 was smaller than T2, and the control voltage on node 439 is increased to decrease the delay through delay circuit 401 such that T1 and T2 are made more equal. Operation of the feedback control loop is such that T1 and T2 are controlled to be equal, and such that the phase difference between the signals C and A is ninety degrees.

Figure 11:
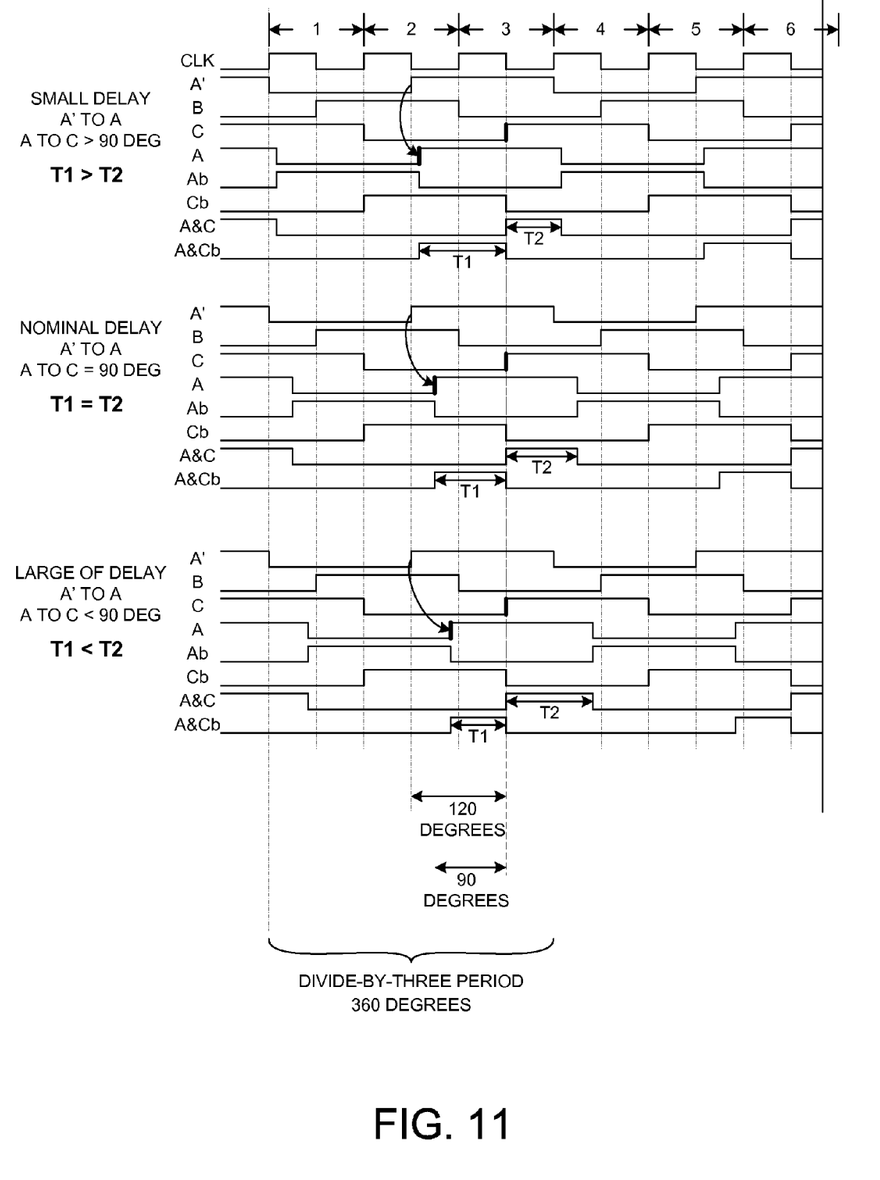
FIG. 11 is a waveform diagram that illustrates an operation of the novel divide-by-three frequency divider 300 of FIG. 10.

Operation of the circuit of FIG. 10 is further explained in connection with the waveform diagram of FIG. 11. The waveform of FIG. 11 actually includes three sets of waveforms. The upper set of waveforms represents a situation in which T1 is larger than T2. The middle set of waveforms represents a situation in which T1 and T2 are equal. The lower set of waveforms represents a situation in which T1 is smaller than T2. As can be seen from the waveforms of FIG. 11, the time T1 is represented by the time that the signal A&Cb is at a digital logic high. The signal A&Cb is the signal present on node 427 in FIG. 10. The signal A&Cb is generated by inverting the first signal C to generate an inverted version Cb of the signal C. The "b" in this notion indicates "the inverse". AND gate 426 performs the logical AND of the signal Cb and the signal A. The notation "A&Cb" indicates the logical AND of the signals "A" and "Cb". Similarly, the time T2 is represented by the time that the signal A&C is at a digital logic high. The signal A&C is the signal present on node 429 in FIG. 10. AND gate 428 performs the logical AND of the signal C and the signal A. The notation "A&C" indicates the logical AND of the signals "A" and "C".

Figure 11A:
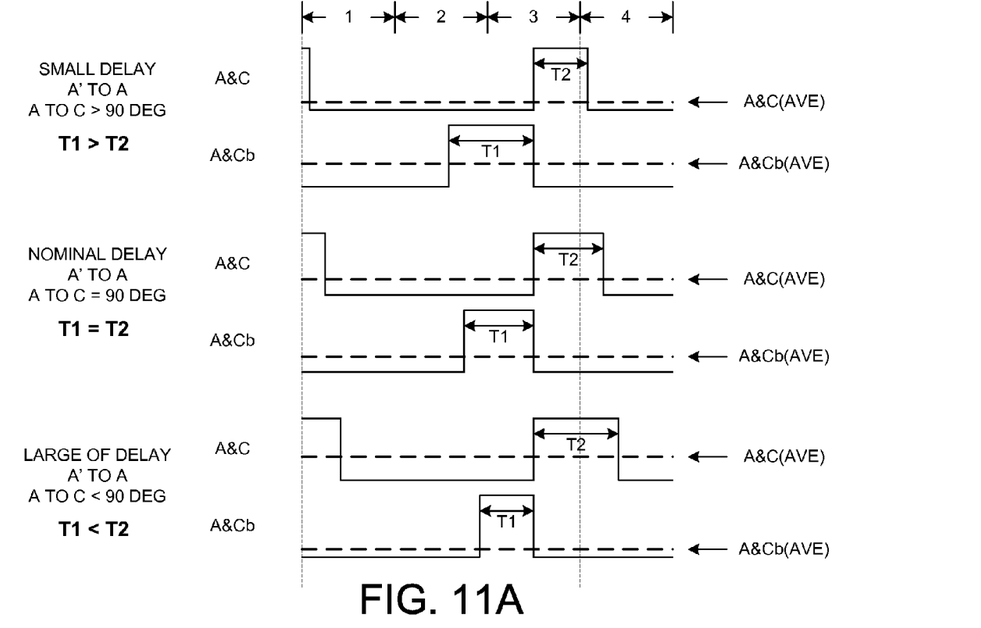
FIG. 11A is a waveform diagram that illustrates how the signals A&Cb and A&C are converted into corresponding voltage level signals A&Cb(AVE) and A&C(AVE).

FIG. 11A illustrates how the signals A&Cb and A&C on nodes 427 and 429 are converted into corresponding voltage level signals A&Cb(AVE) and A&C(AVE) on nodes 432 and 433, respectively. The voltage level signals A&Cb(AVE) and A&C(AVE) are represented in FIG. 11A by horizontally extending dashed lines. The larger the proportion of time that a signal supplied to an input of an RC low-pass filter is high, the higher the proportion of time the capacitor of the RC low-pass filter will be charging up and smaller the proportion of time the capacitor will be discharging down. Accordingly, the larger the proportion of time that a signal supplied to an input of an RC low-pass filter is high, the higher the voltage level signal output by the RC low-pass filter.

Figure 12:
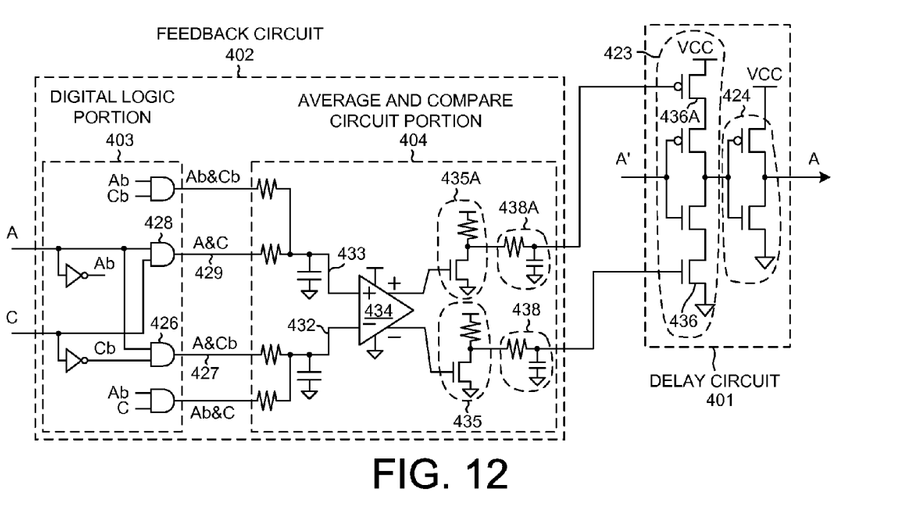
FIG. 12 is a circuit diagram of another embodiment of feedback circuit 402 and delay circuit 401 of the divide-by-three frequency divider 300 of FIG. 10.

Although one way of realizing novel divide-by-three frequency divider 300 is set forth in FIG. 10, there are other ways. FIG. 12 sets forth an example in which digital logic portion 403 generates four digital signals Ab&Cb, A&C, A&Cb and Ab&C. Although operational amplifier 434 in FIG. 10 outputs a single-ended control signal such that one voltage bias control signal VBIASN controls the propagation delay through delay circuit 401, in the example of FIG. 12 operational amplifier 434 outputs a pair of differential signals to a corresponding pair of bias circuits 435 and 435A. Bias circuit 435A has an associated circuit 438A for adding a pole to prevent control loop oscillation. One bias circuit 435 outputs the VBIASN bias voltage onto the gate of NFET 436. The second bias circuit 435A outputs a VBIASP bias voltage onto the gate of a PFET 436A. In the example of the delay circuit 401 in FIG. 12, the second inverter circuit 424 of delay circuit 401 is a simple inverter and only involves two transistors as illustrated. Feedback circuit 402 operates by changing the propagation delay through delay circuit 401 by changing the conductivity of NFET 436 and PFET 436A.

Figure 13:
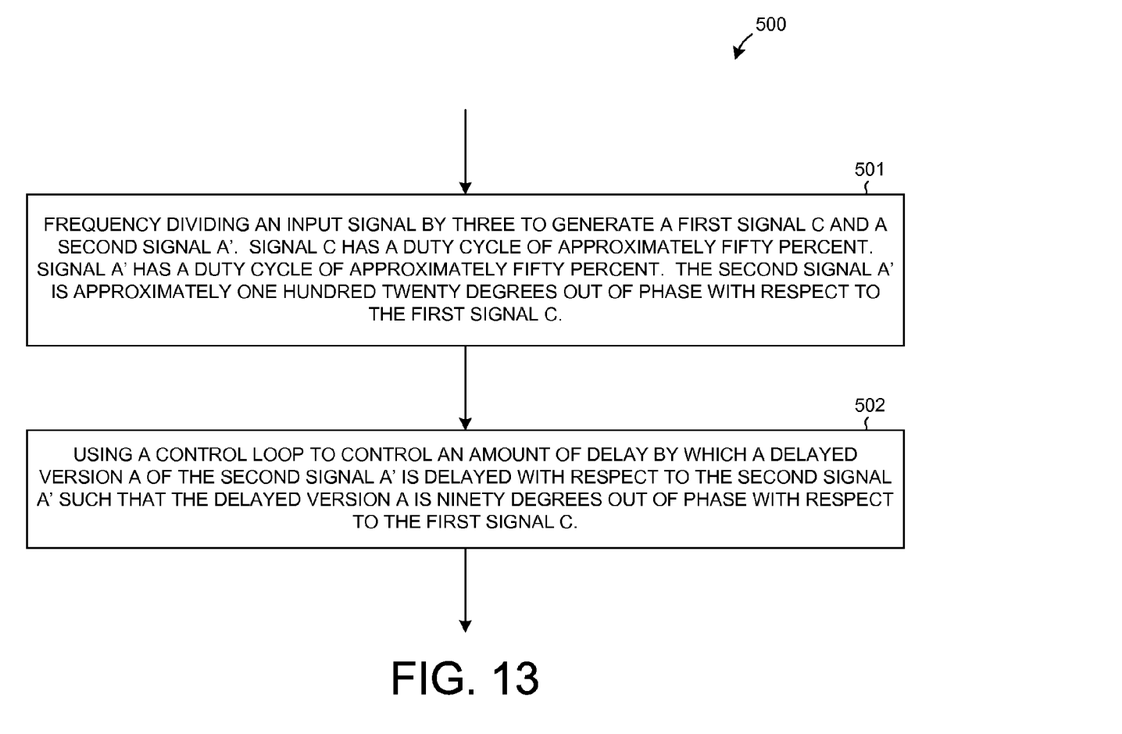
FIG. 13 is a flowchart of a method 500 in accordance with one novel aspect.

FIG. 13 is a flowchart of a method 500 in accordance with one novel aspect. In a first step, an input signal (for example, VCO_OUT) is frequency divided (step 501) by three to generate a first signal C and a second signal A'. The first signal C has a duty cycle of approximately fifty percent and the second signal A' has a duty cycle of approximately fifty percent. The second signal A' is approximately one hundred twenty degrees out of phase with respect to the first signal C.

In a second step, a control loop is used (step 502) to control an amount of delay by which a delayed version A of the second signal A' is delayed with respect to the second signal A' such that the delayed version A of the second signal is ninety degrees out of phase with respect to the first signal C. In one example of the method, the delayed version A of the second signal and the first signal C are used as local oscillator output signals (quadrature signals I and Q) in a radio transmitter and/or receiver of a cellular telephone, and the frequency of the input signal is at least one hundred megahertz.

In one or more exemplary embodiments, the functions described may be implemented in hardware, software, firmware, or any combination thereof. If implemented in software, the functions may be stored on or transmitted over as one or more instructions or code on a computer-readable or processor-readable medium. Computer-readable and processor-readable media includes both computer storage media and communication media including any medium that facilitates transfer of a program from one place to another. A storage media may be any available media that can be accessed by a computer or processor. By way of example, and not limitation, such media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer or processor. Also, a connection may be properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave, then the connection is included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. Execution by processor 105 of a set of instructions stored in processor-readable medium 106 of digital baseband IC 104 in some embodiments causes digital information to be communicated from digital baseband IC 104, across bus conductors 109, and to the novel frequency divider 202 of FIG. 7 such that the novel frequency divider 202 is made to frequency divide by three and to output a pair of quadrature signals (I and Q) whose phases differ by ninety degrees. When frequency divider 202 is set in this way, the frequency of VCO_OUT is of frequency 3F and the quadrature signals are fifty percent duty cycle signals of frequency F.

Although certain specific embodiments are described above for instructional purposes, the teachings of this patent document have general applicability and are not limited to the specific embodiments described above. The feedback circuit 402 can be used to make quadrature frequency dividers that divide by divisors that are not $2^N$ (N is an integer). For example, a quadrature frequency divider having a divisor of 1.5 can be implemented by employing a frequency doubler followed by the divide-by-three quadrature frequency divider described above. The I and Q outputs of the divide-by-three frequency divider can be twenty-five percent duty cycle signals or fifty percent duty cycle signals. Accordingly, various modifications, adaptations, and combinations of the various features of the described specific embodiments can be practiced without departing from the scope of the claims that are set forth below.

What is claimed is:

1. A method comprising:
frequency dividing an input signal by three to generate a first signal C and a second signal A' approximately one hundred twenty degrees out of phase with respect to the first signal C, the first signal C having a duty cycle of approximately fifty percent and the second signal A' having a duty cycle of approximately fifty percent; and
controlling an amount of delay by which a delayed version A of the second signal A' is delayed with respect to the second signal A', the delayed version A of the second signal A' controlled by a control loop to be ninety degrees out of phase with respect to the first signal C.

2. The method of claim 1, wherein controlling the delay amount of A involves:
performing a logical AND operation on the first signal C and the delayed version A of the second signal and thereby generating a third signal;
inverting the first signal C and thereby generating an inverted version Cb of the first signal;
performing a logical AND operation on the inverted version Cb of the first signal and the delayed version A of the second signal and thereby generating a fourth signal; and
controlling the amount of delay of the delayed version A with respect to the second signal A' based on third and fourth signals in the control loop.

3. The method of claim 1, wherein controlling the delay amount of A involves:
generating a third signal indicative of an amount of time T1 between a first edge of the delayed version A of the second signal and an edge of the first signal C; and
generating a fourth signal indicative of an amount of time T2 between the edge of the first signal C and a second edge of the delayed version A of the second signal.

4. The method of claim 3, wherein controlling the delay amount of A further involves:
converting the third signal into a first voltage level, wherein the first voltage level is indicative of the amount of time T1;
converting the fourth signal into a second voltage level, wherein the second voltage level is indicative of the amount of time T2; and
supplying the first and second voltage levels to an operational amplifier, wherein a signal output by the operational amplifier determines how much the delayed version A of the second signal is delayed with respect to the undelayed version A' of the second signal.

5. The method of claim 1, wherein controlling the delay amount of A involves:
a first logic gate generating a third signal indicative of an amount of time T1 between a first edge of the delayed version A of the second signal and an edge of the first signal C; and
a second logic gate generating a fourth signal indicative of an amount of time T2 between the edge of the first signal C and a second edge of the delayed version A of the second signal.

6. The method of claim 1, wherein frequency dividing the input signal further involves generating a third signal B, and wherein controlling the amount of delay of A involves:
performing a logical AND operation on one of the first, second and third signals and another of the first, second and third signals; and
performing a logical AND operation on said one of the first, second and third signals and the inverse of said another of the first, second and third signals.

7. A circuit comprising:
a frequency divider that receives an input signal of frequency 3F and outputs a first signal C of frequency F and outputs a second signal A' of frequency F, wherein the first signal C has a duty cycle of approximately fifty percent and wherein the second signal A' has a duty cycle of approximately fifty percent, wherein the second signal A' is approximately one hundred twenty degrees out of phase with respect to the first signal C;
a delay circuit that receives the second signal A' and outputs a delayed version A of the second signal; and
a feedback circuit that controls the delay circuit such that the delayed version A of the second signal is ninety degrees out of phase with respect to the first signal C.

8. The circuit of claim 7, wherein the feedback circuit comprises:
circuitry that generates a third signal indicative of an amount of time T1 between a first edge of the delayed version A of the second signal and an edge of the first signal C;
circuitry that generates a fourth signal indicative of an amount of time T2 between the edge of the first signal C and a second edge of the delayed version A of the second signal; and
a differential amplifier circuit that receives the third signal and the fourth signal and generates therefrom a control signal, the control signal being supplied to the delay circuit.

9. The circuit of claim 8, wherein the third and fourth signals are digital logic signals.

10. The circuit of claim 8, wherein the third and fourth signals are voltage level signals.

11. The circuit of claim 8, wherein the circuitry that generates the third signal includes a first digital logic gate, and wherein the circuitry that generates the fourth signal includes a second digital logic gate.

12. The circuit of claim 7, wherein the feedback circuit includes:
a first digital logic gate that has an output lead that is coupled to an input lead of a first low-pass filter;
a second digital logic gate that has an output lead that is coupled to an input lead of a second low-pass filter; and
a differential amplifier circuit that receives a signal from the first low-pass filter and that receives a signal from the second low-pass filter, wherein the differential amplifier circuit supplies a control signal to the delay circuit.

13. The circuit of claim 7, wherein the frequency divider comprises:
a first stage comprising a first P-channel field effect transistor (PFET), a second PFET, a first N-channel field effect transistor NFET, and a second NFET, wherein a gate of the first PFET and a gate of the first NFET are coupled together, wherein a drain of the first PFET and a drain of the first NFET are coupled together, wherein a drain of the second PFET is coupled to a source of the first PFET, wherein a drain of the second NFET is coupled to a source of the first NFET;
a second stage comprising a first PFET, a second PFET, a first NFET, and a second NFET, wherein a gate of the first PFET and a gate of the first NFET are coupled together and to the drains of the first PFET and the first NFET of the first stage, wherein a drain of the first PFET and a drain of the first NFET are coupled together, wherein a drain of the second PFET is coupled to a source of the first PFET, wherein a drain of the second NFET is coupled to a source of the first NFET; and a third stage comprising a first PFET, a second PFET, a first NFET, and a second NFET, wherein a gate of the first PFET and a gate of the first NFET are coupled together and to the drains of the first PFET and the first NFET of the second stage, wherein a drain of the first PFET and a drain of the first NFET are coupled together, wherein a drain of the second PFET is coupled to a source of the first PFET, wherein a drain of the second NFET is coupled to a source of the first NFET, wherein the drains of the first PFET and first NFET are coupled to the gates of the first PFET and the first NFET of the first stage, wherein the gates of the second PFETs of the first, second and third stages and the gates of the second NFETS of the first, second and third stages are coupled to receive the input signal.

14. The circuit of claim 7, wherein the circuit is a local oscillator in a radio receiver, and wherein the input signal has a frequency of at least one hundred megahertz.

15. The circuit of claim 7, wherein the feedback circuit includes:
   a first digital logic gate that outputs the logical AND of the second signal and the inverse of the first signal;
   a second digital logic gate that outputs the logical AND of the first signal and the second signal;
   a third digital logic gate that outputs the logical AND of the first signal and the inverse of the second signal;
   a fourth digital logic gate that outputs the logical AND of the inverse of the first signal and the inverse of the second signal; and
   a circuit that receives signals output from the first, second, third and fourth digital logic gates, and that supplies a control signal to the delay circuit.

16. The circuit of claim 7, wherein the delay circuit includes a digital logic inverter and an N-channel field effect transistor (NFET), wherein the digital logic inverter has a signal input lead, a signal output lead, a power supply lead, and a ground lead, wherein the ground lead is resistively couplable to ground potential through the NFET.

17. The circuit of claim 16, wherein the delay circuit further includes a P-channel field effect transistor (PFET), wherein the power supply lead of the digital logic inverter is resistively couplable to a supply voltage through the PFET.

18. A circuit comprising:
   a divide-by-three circuit that receives an input signal of frequency 3F, and that outputs a first signal C and a second signal A', wherein the first signal C and the second signal A' have the same frequency F, wherein the first signal C and the second signal A' are approximately one hundred twenty degrees out of phase with respect to one another;
   a delay circuit that receives the second signal A' from the divide-by-three circuit and outputs a delayed version A of the second signal; and
   means for controlling the delay circuit in a feedback control loop such that the delayed version A of the second signal is ninety degrees out of phase with respect to the first signal C.

19. The circuit of claim 18, wherein the circuit is a local oscillator in a radio receiver, and wherein the input signal has a frequency of at least one hundred megahertz.

20. A tangible storage medium having stored thereon processor-executable software instructions configured to cause a processor to perform steps comprising:
   frequency dividing an input signal by three to generate a first signal C and a second signal A' approximately one hundred twenty degrees out of phase with respect to the first signal C, the first signal C having a duty cycle of approximately fifty percent and the second signal A' having a duty cycle of approximately fifty percent and
   controlling an amount of delay by which a delayed version A of the second signal A' is delayed with respect to the second signal A', the delayed version A of the second signal A' controlled by a control loop to be ninety degrees out of phase with respect to the first signal C.

21. The tangible storage medium of claim 20, wherein the tangible storage medium has processor-executable software instructions configured to cause a processor to perform farther steps comprising:
   receiving the input signal from a voltage controlled oscillator (VCO).

22. The tangible storage medium of claim 20, wherein the tangible storage medium has processor-executable software instructions configured to cause a processor to perform further steps comprising:
   performing a logical AND operation on the first signal C and the delayed version A of the second signal and thereby generating a third signal;
   inverting the first signal C and thereby generating an inverted version Cb of the first signal;
   performing a logical AND operation on the inverted version Cb of the first signal and the delayed version A of the second signal and thereby generating a fourth signal; and
   controlling the amount of delay of the delayed version A with respect to the second signal A' based on third and fourth signals in the control loop.

23. The tangible storage medium of claim 20, wherein the tangible storage medium has processor-executable software instructions configured to cause a processor to perform further steps comprising:
   generating a third signal indicative of an amount of time T1 between a first edge of the delayed version A of the second signal and an edge of the first signal C; and
   generating a fourth signal indicative of an amount of time T2 between the edge of the first signal C and a second edge of the delayed version A of the second signal.

24. The tangible storage medium of claim 23, wherein the tangible storage medium has processor-executable software instructions configured to cause a processor to perform further steps comprising:
   converting the third signal into a first voltage level, wherein the first voltage level is indicative of the amount of time T1;
   converting the fourth signal into a second voltage level, wherein the second voltage level is indicative of the amount of time T2; and
   supplying the first and second voltage levels to an operational amplifier, wherein a signal output by the operational amplifier determines how much the delayed version A of the second signal is delayed with respect to the undelayed version A' of the second signal.

25. The tangible storage medium of claim 20, wherein the tangible storage medium has processor-executable software instructions configured to cause a processor to perform further steps comprising:
   a first logic gate generating a third signal indicative of an amount of time T1 between a first edge of the delayed version A of the second signal and an edge of the first signal C; and a second logic gate generating a fourth signal indicative of an amount of time T2 between the edge of the first signal C and a second edge of the delayed version A of the second signal.

26. The tangible storage medium of claim 20, wherein the tangible storage medium has processor-executable software instructions configured to cause a processor to perform further steps comprising:
generating a third signal B;
performing a logical AND operation on one of the first, second and third signals and another of the first, second and third signals; and
performing a logical AND operation on said one of the first, second and third signals and the inverse of said another of the first, second and third signals.

27. A circuit comprising:
means for frequency dividing an input signal by three to generate a first signal C and a second signal A' approximately one hundred twenty degrees out of phase with respect to the first signal C, the first signal C having a duty cycle of approximately fifty percent and the second signal A' having a duty cycle of approximately fifty percent; and
means for controlling an amount of delay by which a delayed version A of the second signal A' is delayed with respect to the second signal A', the delayed version A of the second signal A' controlled by a control loop to be ninety degrees out of phase with respect to the first signal C.

28. The circuit of claim 27, wherein said means for controlling the delay amount of A further comprises:
means for performing a logical AND operation on the first signal C and the delayed version A of the second signal and thereby generating a third signal;
means for inverting the first signal C and thereby generating an inverted version Cb of the first signal;
means for performing a logical AND operation on the inverted version Cb of the first signal and the delayed version A of the second signal and thereby generating a fourth signal; and
means for controlling the amount of delay of the delayed version A with respect to the second signal A' based on third and fourth signals in the control loop.

29. The circuit of claim 27, wherein said means for controlling the delay amount of A further comprises:
means for generating a third signal indicative of an amount of time T1 between a first edge of the delayed version A of the second signal and an edge of the first signal C; and
means for generating a fourth signal indicative of an amount of time T2 between the edge of the first signal C and a second edge of the delayed version A of the second signal.

30. The circuit of claim 29, wherein said means for controlling the delay amount of A further comprises:
means for converting the third signal into a first voltage level, wherein the first voltage level is indicative of the amount of time T1;
means for converting the fourth signal into a second voltage level, wherein the second voltage level is indicative of the amount of time T2; and
means for supplying the first and second voltage levels to an operational amplifier, wherein a signal output by the operational amplifier determines how much the delayed version A of the second signal is delayed with respect to the undelayed version A' of the second signal.

31. The circuit of claim 27, wherein said means for frequency dividing the input signal further comprises means for generating a third signal B, and wherein said means for controlling the amount of delay of A further comprises:
means for performing a logical AND operation on one of the first, second and third signals and another of the first, second and third signals; and
means for performing a logical AND operation on said one of the first, second and third signals and the inverse of said another of the first, second and third signals.

* * * * *